United States Patent [19]
Fukuda et al.

[11] Patent Number: 5,660,681
[45] Date of Patent: Aug. 26, 1997

[54] METHOD FOR REMOVING SIDEWALL PROTECTIVE FILM

[75] Inventors: Seiichi Fukuda; Tetsuya Tatsumi, both of Kanagawa, Japan

[73] Assignee: Sony Corporation, Tokyo, Japan

[21] Appl. No.: 699,079

[22] Filed: Aug. 19, 1996

Related U.S. Application Data

[63] Continuation of Ser. No. 338,086, Nov. 9, 1994, abandoned.

[30] Foreign Application Priority Data

Nov. 16, 1993 [JP] Japan ................... 5-286640

[51] Int. Cl.$^6$ .................................. H01L 21/302
[52] U.S. Cl. ................... 438/695; 216/46; 438/704; 438/963; 438/720
[58] Field of Search ................. 156/662.1, 643.1, 156/646.1, 653.1; 437/225; 216/79, 46

[56] References Cited

U.S. PATENT DOCUMENTS

| | | | |
|---|---|---|---|
| 4,784,720 | 11/1988 | Douglas | 156/643 |
| 5,185,058 | 2/1993 | Cathey, Jr. | 156/643 |
| 5,240,554 | 8/1993 | Hori et al. | 156/643 |

FOREIGN PATENT DOCUMENTS 58-132933  8/1983  Japan .

OTHER PUBLICATIONS

"Film Redeposition On Vertical Surfaces During Reactive Ion Etching"; Allred et al.; 1989; J. Vac. Sci; 7(3), pp. 505–511.

"Silicon Processing for the VLSI. Era–vol. 1—Process Technology"; Wolf et al.; Lattice Press; Sunset Beach, Ca; ©1986; pp. 564–565.

*Primary Examiner*—R. Bruce Breneman
*Assistant Examiner*—George Goudreau
*Attorney, Agent, or Firm*—Hill, Steadman & Simpson

[57] ABSTRACT

A method for processing a layer of a silicon-based material on a wafer by which a sidewall protective film may be removed sufficiently and efficiently. An etching gas capable of yielding chlorine- or bromine-based chemical species and oxygen-based chemical species is used for dry etching a polycide film formed on a gate insulating film, plasma processing with an oxygen-based gas is then carried out for ashing the resist mask and removing carbonaceous components in the sidewall protective film. In addition, the sidewall protective film is oxidized so that the composition to that of stoichiometrically stable $SiO_2$ is approached. Subsequently, the modified sidewall protective film is removed by processing with a dilute hydrofluoric acid solution. Since this sufficiently removes the sidewall protective film, it becomes possible to reduce the amount of dust and to improve coverage of a film to be formed by the next step. In this manner, a semiconductor device may be prepared with improved reliability and production yield.

3 Claims, 2 Drawing Sheets

METHOD FOR REMOVING SIDEWALL PROTECTIVE FILM

This is a continuation of application Ser. No. 08/338,086, filed Nov. 9, 1994, now abandoned.

BACKGROUND OF THE INVENTION

1. Field of the Invention

This invention relates to a method for processing a layer of the silicon-based material applicable to fine processing, such as in a semiconductor process. More particularly, it relates to a method for post-processing for a dry etching process employing a silicon compound as a sidewall protective film.

2. Description of the Related Art

Recently, in keeping with the increasingly high integration degree of an integrated circuit, such as VLSI or ULSI, the design rule in semiconductor devices has also been refined. In the field of dry etching, there has been raised a strong demand for simultaneous attainment of high selectivity, practical etch rate, low pollution and low damage at as satisfactory a level as possible. However, since these requirements need to be compromised among one another, the present-day practice is to perform etching by suitably adjusting these requirements within a practicable acceptable level.

Heretofore, chlorofluorocarbon gases (CFC gases) as exemplified by FLON 113 ($C_2Cl_3F_3$) have been widely employed for etching a silicon-based material, such as single-crystal silicon, polysilicon, high melting metal silicide or polycide. Recently, however, stringent regulations are put on the use of CFC gases, to say nothing of gases designated as specified FLON, such as the above-mentioned FLON 113. Thus a variety of alternative gases have been proposed.

Many of these alternative gases employ halogen-based chemical species other than fluorine-based chemical species, that is, chlorine-based or bromine-based chemical species, as main etchants. It is specifically intended to realize shape anisotropy by an ion-assist mechanism by $Cl^+$ or $Br^+$, instead of by fluorine radicals $F^*$ liable to spontaneous chemical reaction with the layer of the silicon-based material, and to realize high selectivity for a gate insulating film ($SiO_x$), a material for an underlying layer in case of performing gate electrode processing.

Recently, there has also been proposed a method of performing etching using oxygen-based chemical species in co-existence with the above etchants, such as Cl- or Br-based etchants, and realizing sidewall protection using reaction products such as $SiO_x$ based materials.

In the Extended Abstract to the 39th Lecture Meeting of the Association of Applied Physics (Spring Meeting of 1992), lecture number 28p-NC-4, page 504, there is disclosed a technique of coating a resist mask with the $SiO_2$ based material in the Si etching employing the $HBr/O_2$ mixed gas for inhibiting the recession of the resist mask for achieving high shape anisotropy.

The formation of, for example, a gate electrode by etching under co-existence of the Cl- and Br-based etchants and the oxygen-based chemical species as described above, will now be explained in detail.

Referring to FIG. 1, a resist mask 7, patterned to a pre-set shape, is formed on a wafer comprised of a gate insulating film 2, a polycide film 5 made up of a polysilicon layer 3 and a high melting metal silicide layer 4, and an antireflection film 6, stacked in this order on a silicon substrate 1.

Then, using the resist mask 7 as a mask, an $HBr/O_2$ mixed gas is subjected to discharge dissociation in order to carry out reactive ion etching (RIE) for etching the polycide layer 5. By such RIE, an area not covered by the resist mask 7 is removed, while the resist mask 7 is protected by a sidewall protective film 8, as shown in FIG. 2.

The sidewall protective film 8 prevents the resist mask 7 from being receded by etching, and thus contributes to attainment of the shape anisotropy. The sidewall protective film 8, composed mainly of an $SiO_x$-based product yielded on direct oxidation of Si atoms expelled from the polycide film 5 or on oxidation of the etching reaction product $SiBr_x$, also contains carbonaceous reaction products yielded by forward sputtering of the resist mask 7.

After etching the polycide film 5 as discussed above, it is necessary to carry out removal of the resist mask 7 and the sidewall protection film 8 by way of post-processing. Such post-processing is usually carried out by processing with a dilute hydrofluoric acid solution followed by plasma processing using an oxygen-based gas.

It is specifically intended by this process to remove the sidewall protection film 8 of the $SiO_x$-based products by dissolution with the dilute hydrofluoric acid solution and subsequently remove the resist mask 7 of the organic material by plasma processing with the oxygen-based gas. However, even if processing with the dilute hydrofluoric acid solution and the plasma processing with the oxygen-based gas are carried out in this order, the sidewall protection film 8 is actually left as shown in FIG. 3, such that sufficient removal can hardly be achieved.

If the wafer is sent to the next process, such as the process of forming an interlayer insulating film, with the sidewall protective film thus being left, the sidewall protective film tends to be scattered to produce dust or deteriorate the coverage by the interlayer insulating film.

OBJECT AND SUMMARY OF THE INVENTION

In view of the above-depicted problems of the prior art, it is an object of the present invention to provide a method for processing a layer of a silicon-based material whereby the sidewall protection film may be removed sufficiently and efficiently.

The reason the sidewall protective film cannot be removed sufficiently by processing with the dilute hydrofluoric acid followed by plasma processing with the oxygen-based gas is that the $SiO_x$-based product constituting the sidewall protective film 8 is not of a stoichiometrically stable composition and is not necessarily high in solubility in the dilute hydrofluoric acid solution, such that the carbonaceous reaction product present in the sidewall protection film acts in some way for deteriorating the solubility of the $SiO_x$-based product in the dilute hydrofluoric acid solution.

The present inventors have found that solubility of the sidewall protection film in the dilute hydrofluoric acid may be improved by modifying the sidewall protective film by oxygen plasma processing for bringing its composition to close to that of $SiO_2$. This finding has led to fulfillment of the present invention.

According to the present invention, there is provided a method for processing a layer of a silicon-based material on a wafer comprising dry-etching the layer of the silicon-based material using a organic resist pattern as a mask, plasma-processing the wafer using an oxygen-based gas for removing the organic resist pattern and modifying a sidewall protective film formed during the etching, and removing the modified sidewall protective film.

By the modification of the sidewall protection film herein is meant removing carbon atoms in the sidewall protection film by plasma processing using the oxygen-based gas and oxidizing the $SiO_x$ based product constituting the sidewall protective film for realizing a composition close to that of stoichiometrically stable $SiO_2$.

The above-mentioned dry etching is preferably performed using an etching gas capable of generating oxygen-based chemical species and halogen-based chemical species other than fluorine-based chemical species.

Among the gases that may be employed as etching gases, there are those gases generating the halogen-based chemical species, such as $Cl_2$, HCl, $NCl_x$, $Br_2$ or HBr, and those gases generating the oxygen-based gases, such as $O_2$, $ClO_x$ and $NO_x$. The oxygen-based chemical species and the halogen-based chemical species may be generated by the same or different gas(es).

If etching is performed using halogen-based chemical species other than fluorine-based chemical species, such as Cl or Br, the $SiO_x$ based product is deposited as the sidewall protection film. However, if etching is performed using fluorine-based chemical species, it is difficult to deposit the $SiO_x$ product as a sidewall protection film. The reason is that the interatomic binding energy of the Si—F bond is larger than that of the Si—O bond, so that, if Si atoms are yielded by etching from the silicon-based material, $SiO_x$ having a higher vapor pressure is preferentially generated, while $SiO_x$ is hardly deposited.

The dry etching conditions may be suitably optimized as conventionally depending on the type or the film thickness of the layer of the silicon-based material to be etched or on the type of the etching gas employed.

If the plasma processing is carried out using the oxygen-based gas after dry etching the layer of the silicon-based material, the sidewall protective film is modified as described above to a composition proximate to that of $SiO_2$. Thus the sidewall protective film may be removed on dissolution by processing with the dilute hydrofluoric acid solution.

The plasma processing with the oxygen-based gas and the processing with the dilute hydrofluoric acid solution may be carried out as conventionally under suitably optimized conditions.

The reason the sidewall protective film, generated at the time of etching of the layer of the silicon-based material, can be removed by performing the plasma processing prior to the processing with the dilute hydrofluoric acid solution employing the oxygen-based gas, is now explained.

The interatomic binding energy of the C—O linkage is preponderantly larger than that of the Si—O linkage. Consequently, the plasma processing with the oxygen-based gas results in preferential extraction of carbon atoms from the sidewall protective film in which carbon contents and Si contents exist together in an unstable composition. Thus the carbon atoms are removed from the sidewall protective film by the above processing, such that the sidewall protective film is constituted substantially exclusively by the $SiO_x$ based products.

In addition, the $SiO_x$ based product constituting the sidewall protective film is oxidized and approaches $SiO_x$ having a stoichiometrically stable composition.

Of course, the organic resist mask is simultaneously removed on combustion by the plasma processing employing the oxygen-based gas.

In this manner, the plasma processing by the oxygen-based gas modifies the sidewall protective film for increasing its solubility in the dilute hydrofluoric acid solution. Consequently, the plasma processing with the oxygen-based gas followed by the processing with the dilute hydrofluoric acid solution results in sufficient removal of the sidewall protection film.

If the sidewall protective film is sufficiently removed, dust generation may be prevented, while the interlayer insulating film may be prevented from being deteriorated in coverage.

It is noted that the processing of the layer of the silicon-based material according to the present invention leads to sufficient and highly efficient removal of the sidewall protective film. Thus it becomes possible to make the best use of the merit of the etching by the chlorine-based chemical species or the bromine-based chemical species, that is that dry etching with superior anisotropy and high selectivity may be achieved without employing the CFC based gases.

On the other hand, since the sidewall protective film may be removed sufficiently, dust generation may be inhibited, and the next following process step may be improved in reliability, thus rendering it possible to improve the quality and the yield of the produced semiconductor devices.

DETAILED DESCRIPTION OF THE PREFERRED EMBODIMENTS

Figure 1:
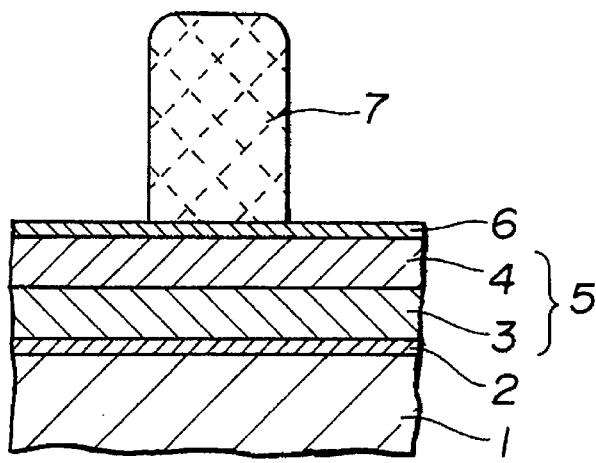
FIG. 1 is a cross-sectional view showing the conventional processing process for a layer of the silicon-based material and particularly showing the wafer prior to etching.
Figure 2:
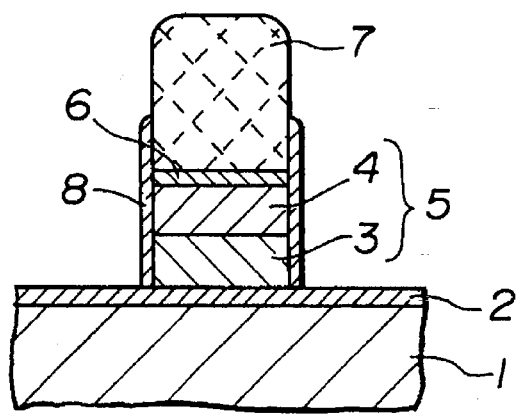
FIG. 2 is a schematic cross-sectional view showing the wafer of FIG. 1 after etching of the antireflective film and the polycide layer.
Figure 3:
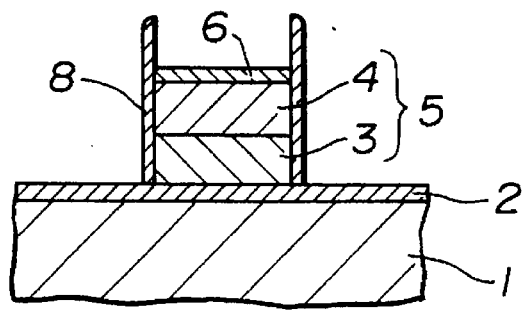
FIG. 3 is a schematic cross-sectional view showing the wafer of FIG. 1 after removal of the resist film, with the sidewall protective film being left.

Referring to the drawings, preferred embodiments of a processing method for processing a layer of a silicon-based material according to the present invention will be explained in detail.

In the present embodiment, the polycide film 5 was etched using a $Cl_2$ gas and an $O_2$ gas as etching gases for producing a gate electrode.

The process of forming the gate electrode is explained by referring to FIGS. 4 to 7, by way of a first embodiment.

Figure 4:
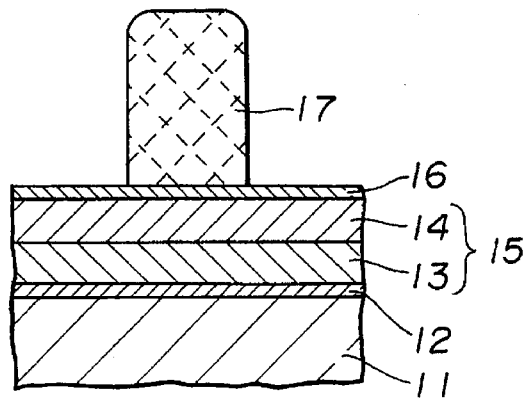
FIG. 4 is a schematic cross-sectional view showing gate electrode processing according to the present invention, and particularly showing the wafer prior to etching.

Referring to FIG. 4, a gate insulating film 12, a polycide film 15 (gate electrode layer) made up of an $n^+$ polysilicon layer 13 and a tungsten silicide ($WSi_x$) layer 14, and an antireflection layer 16, are formed in this order on an Si substrate 11. A resist mask 17, patterned to a pre-set shape, was then formed thereon.

The gate insulating film 12 was formed to a thickness of 10 nm by thermal oxidation of the Si substrate 11 using a batch type thermal diffusion furnace. The $n^+$ polysilicon layer 13 and the tungsten silicide ($WSi_x$) layer 14, making up the polycide film 15, were prepared, each to a thickness of 100 nm, under the following conditions:

That is, the $n^+$ polysilicon layer 13 was formed from 400 sccm of an $SiH_4$ gas and 100 sccm of a $PH_3$ gas ($SiH_4$ base 0.5%), using an LP CVD device, under a pressure of 40 Pa and at a film-forming forming temperature of 550° C.

The tungsten silicide ($WSi_x$) layer 14 was formed from 1000 sccm of an $SiH_4$ gas and 10 sccm of a $WF_6$ gas, using an LP CVD device, under a pressure of 26.6 Pa and at a film-forming temperature of 380° C.

On the other hand, the antireflection film 16, a $SiO_xN_y$ film, was formed to a thickness of 28.3 nm, under the following conditions:

That is, the antireflection film 16 was formed from 50 sccm of an $SiH_4$ gas and 50 sccm of an $N_2O$ gas, using a plasma CVD device, under a pressure of 330 Pa and at a film-forming temperature of 380° C., with the RF power being 190 W (13.56 MHz).

The resist mask 17 was formed to a desired patten by coating a positive type novolak type photoresist material, for example, to a thickness of 1.2 μm, on the antireflection film 16, and by performing selective light exposure and development by i rays (365 nm).

The antireflection film 16 and the polycide film 15 on the wafer prepared as described above were dry-etched, using the above-mentioned resist mask as a wafer, under the following conditions:

That is, the dry etching was performed by a magnetic micro-wave plasma etching device, using 74 sccm of a $Cl_2$ gas and 6 sccm of an $O_2$ gas as etching gases, under the gas pressure of 0.67 Pa and an RF bias of 100 W (2.45 GHz), at a stage temperature of 20° C., with the micro-wave power of 800 W (2.45 GHz).

In addition, for providing a selectivity ratio for the gate insulating film 12, over-etching was performed to a thickness of 100 nm in terms of the thickness of the polysilicon layer, using a decreased RF bias, under the following conditions:

That is, the overetching was performed by a magnetic micro-wave plasma etching device, using 74 sccm of a $Cl_2$ gas and 6 sccm of an $O_2$ gas as etching gases, under the gas pressure of 0.67 Pa and an RF bias of 100 W (2.45 GHz), at a stage temperature of 20° C., with the micro-wave power of 800 W (2.45 GHz).

Figure 5:
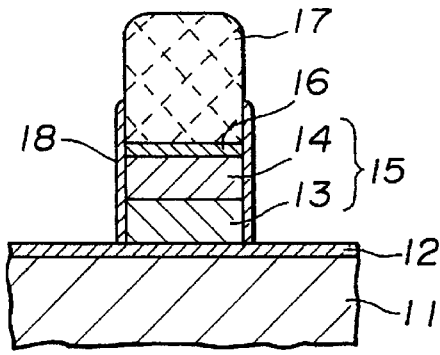
FIG. 5 is a schematic cross-sectional view showing the wafer of FIG. 4 after etching of the antireflective film and the polycide layer.

By the above-described etching and over-etching, the antireflection film 16 and the polycide film 15 were removed in a region not masked by the resist mask 17, while simultaneously a sidewall protection film 18 was formed, as shown in FIG. 5.

The sidewall protective film 18 deposited on the pattern sidewall surface was mainly composed of $SiO_x$ products, resulting from direct oxidation by oxygen of Si atoms expelled from the anti-reflection film 16 and the polycide film 15, or from oxidation of the etching reaction product $SiBr_x$. However, carbonaceous reaction products, such as $CCl_x$ polymers, derived from decomposition products of the resist mask 17, were also contained in the protective film 18.

The wafer etched as described above, was plasma-processed using an oxygen-based gas under the following conditions:

That is, the oxygen plasma processing was carried out with a micro-wave plasma ashing device, using 1,000 sccm of an $O_2$ gas as ashing gas, at a wafer heating temperature of 200° C. and a micro-wave power of 1200 W (2.45 GHz).

Figure 6:
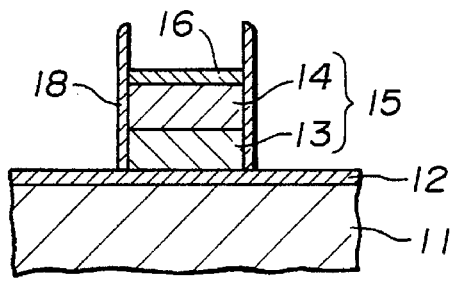
FIG. 6 is a schematic cross-sectional view showing the wafer of FIG. 5 after removal of the resist film.

Since the carbon components were ashed off by the above-described oxygen plasma processing, the resist mask 17 was sufficiently removed, as shown in FIG. 6. In the sidewall protection film 18, the carbonaceous components were ashed off, while the $SiO_x$ product was oxidized to give a stoichiometrically stable composition close to that of $SiO_2$.

For removing the sidewall protection film, modified as described above, it was processed with a dilute hydrofluoric acid solution using a liquid tank dip type rinsing device.

Thus the wafer was dipped for 20 seconds in a 0.5% aqueous HF solution and rinsed for 800 seconds with deionized water (ultra-pure water). The wafer was then rinsed for 300 seconds with final finishing deionized water (ultra-pure water) and subsequently dried for 1200 seconds with isopropyl alcohol.

Figure 7:
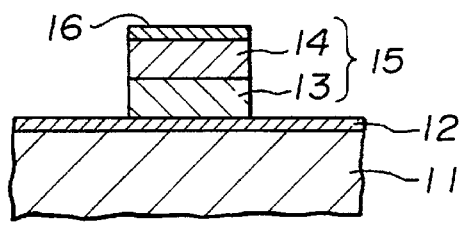
FIG. 7 is a schematic cross-sectional view showing the wafer of FIG. 6 after removal of the sidewall protection film.

By the above-described processing with a dilute hydrofluoric acid (HF) solution, the sidewall protective film 18 was sufficiently removed without any residues, as shown in FIG. 7.

By the above-described gate electrode processing and post-processing, as in the present embodiment, post-processing after dry etching could be carried out efficiently without residual portions of the sidewall protection film 18.

The second embodiment of the present invention will now be explained.

In the present Example, an $HBr/O_2$ mixed gas was employed during over-etching during the gate electrode processing as in Embodiment 1.

Referring to FIG. 4, a gate insulating film 12, a polycide film 15 (gate electrode layer) made up of an $n^+$ polysilicon layer 13 and a tungsten silicide ($WSi_x$) layer 14, and an antireflection layer 16, were formed in this order on an Si substrate 11. A resist mask 17, patterned to a pre-set shape, was then formed.

The dry etching of the anti-reflection film 16 and the polycide film 15 was then carried out, using the resist mask 17 as a mask, up to the state of just-etching, and subsequently, over-etching was carried out under the following conditions:

That is, the overetching was performed by a magnetic micro-wave plasma etching device, using 120 sccm of an HBr gas and 4 sccm of an $O_2$ gas as etching gases, under the gas pressure of 1.33 Pa and an RF bias of 70 W (2 MHz), at a stage temperature of 20° C., with the micro-wave power of 800 W (2.45 GHz).

The over-etching under the above conditions is such etching in which Br acts as a gas contributing to etching in place of Cl. Consequently, a higher selectivity ratio for the gate insulating film was achieved than attainable with the over-etching carried out in Embodiment 1.

By the above-described etching and over-etching, the antireflection film 16 and the polycide film 15 were removed in a region not masked by the resist mask 17, while simultaneously a sidewall protection film 18 was formed.

The sidewall protective film 18 was composed of a $CBr_x$ polymer and $SiBr_x$ etc., in addition to $SiO_x$ products, $CCl_x$ polymers etc.

The wafer etched as described above was plasma-processed with an oxygen-based gas under the following conditions:

That is, the oxygen plasma processing was carried out with a micro-wave plasma ashing device, using 1,000 sccm of an $O_2$ gas and 5 sccm of an $N_2$ gas as ashing gas, at a wafer heating temperature of 200° C. and a micro-wave power of 1200 W (2.45 GHz).

The carbonaceous components were ashed off by the above-mentioned oxygen plasma processing and the resist mask 17 was also removed as shown in FIG. 8. On the other hand, the $SiO_x$ products were oxidized to give a composition close to that of stoichiometrically stable $SiO_2$.

For removing the sidewall protective film 18, modified as described above, the wafer was processed with a dilute hydrofluoric acid (HF) solution, using a spray type spin cleaning device, under the following conditions:

That is, the wafer was first dissolved in a 0.5% aqueous HF solution under a spray nozzle pressure of $1.47 \times 10^5$ Pa and a spin rpm of 500, at a medicament temperature of 20° C., for a processing time of 20 seconds. The wafer was then rinsed with ultra pure water for 30 seconds using a spray nozzle pressure of $1.47 \times 10^5$ Pa and spin rpm of 500. The wafer was then finish-rinsed with ultra-pure water for 80 seconds, using a spray nozzle pressure of $1.47 \times 10^5$ Pa and a spin rpm of 500. Finally, the wafer was dried for 60 seconds at a spin rpm of 2500.

By the above-described processing with the dilute hydrofluoric acid solution, the sidewall protective film 18 was sufficiently removed without any residues, as shown in FIG. 7. Since the processing with the dilute HF solution was carried out using spray type spin rinsing, dust deposition from the medicament solution such as occurs with the dip type device was hardly induced, so that the particle level could be lowered as compared to that with the Embodiment 1.

By the above-described gate electrode processing and post-processing, the sidewall protective wall 8 could be removed sufficiently and highly efficiently.

What is claimed is:

1. A method for processing a layer of a silicon-based material on a wafer comprising the steps of:

dry-etching the layer of the silicon-based material using an organic resist pattern as a mask to remove silicon-based material which is not masked by the resist and to form a sidewall protective film including a non-stoichiometric $SiO_x$ material, wherein the dry-etching is carried out using an etching gas capable of generating oxygen-based chemical species and non-fluorine halogen based chemical species;

plasma processing the dry-etched wafer using an oxygen-based gas to remove the organic resist pattern and to form a modified sidewall protective film having a composition which is substantially a stoichiometric $SiO_2$ film; and removing the modified sidewall protective film with a dilute hydrofluoric acid solution.

2. A method as defined in claim 1, wherein the silicon-based material is polysilicon.

3. A method as defined in claim 1, wherein the silicon-based material is polycide.

* * * * *